United States Patent
Sliger et al.

(10) Patent No.: US 6,466,999 B1
(45) Date of Patent: Oct. 15, 2002

(54) PREPROCESSING A REFERENCE DATA STREAM FOR PATCH GENERATION AND COMPRESSION

(75) Inventors: Michael V. Sliger, Issaquah; Thomas D. McGuire, Woodinville; Richard M. Shupak, Bellevue, all of WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/282,583

(22) Filed: Mar. 31, 1999

(51) Int. Cl.⁷ .............................. G06F 13/14; G06K 9/36
(52) U.S. Cl. .............................. 710/68; 710/33; 710/35; 710/62; 710/65; 707/101
(58) Field of Search .............................. 710/65, 68, 62, 710/35, 33; 707/101

(56) References Cited

U.S. PATENT DOCUMENTS

| | | | |
|---|---|---|---|
| 5,150,430 A | 9/1992 | Chu | |
| 5,455,577 A | 10/1995 | Slivka et al. | |
| 5,499,357 A | 3/1996 | Sonty et al. | |
| 5,521,597 A | 5/1996 | Dimitri | |
| 5,537,489 A | 7/1996 | Sinden et al. | |
| 5,563,595 A | 10/1996 | Strohacker | |
| 5,572,206 A | 11/1996 | Miller et al. | |
| 5,588,075 A | * 12/1996 | Chiba et al. | 382/239 |
| 5,600,834 A | 2/1997 | Howard | |
| 5,608,396 A | 3/1997 | Cheng et al. | |
| 5,652,878 A | 7/1997 | Craft | |
| 5,838,678 A | * 11/1998 | Davis et al. | 370/389 |
| 5,838,963 A | 11/1998 | Griffiths | |
| 5,857,187 A | 1/1999 | Uenoyama et al. | |
| 5,857,205 A | 1/1999 | Roth | |
| 5,955,977 A | * 9/1999 | Lei | 341/107 |
| 5,956,724 A | 9/1999 | Griffith | |
| 5,956,733 A | 9/1999 | Nakano et al. | |
| 5,978,795 A | 11/1999 | Poutanen et al. | |
| 6,219,457 B1 | * 4/2001 | Potu | 382/246 |
| 6,271,934 B1 | * 8/2001 | Hayashi | 358/1.9 |

FOREIGN PATENT DOCUMENTS

EP   462 363 A2   12/1991

OTHER PUBLICATIONS

IBM Tech. Discl. Bull., vol. 39, No. 3, pp. 339–340 (Mar. 1996).
IBM Tech. Discl. Bull., vol. 37, No. 4B, pp. 325–328 (Apr. 1994).

(List continued on next page.)

*Primary Examiner*—Jeffrey Gaffin
*Assistant Examiner*—Rehana Perveen
(74) *Attorney, Agent, or Firm*—Klarquist Sparkman, LLP (57) ABSTRACT

A data compressor uses data known to exist on a destination computer for compressing an input data stream by encoding portions of the input data stream as references to matching portions of the known data. The known data is preprocessed to better correlate with the input data stream. The preprocessing includes identifying and modifying internal references in the known data, such as relative offsets and addresses of jump and call instructions in executable code or cross references and hyperlinks in documents. The preprocessing is driven by generating a set of data that describes specific individual modifications or alternatively indicates relationships between the known data and the input data stream, such as code or data block motion, from which individual modifications can be deterministically made. This generated descriptive data is included with the compressed data stream so that identical preprocessing can be applied to the known data at the destination computer based on the generated descriptive data prior to decompression. Preprocessing the known data improves compression of the input data stream since changed internal references that interrupt matches of the input data stream to the known data can be eliminated.

32 Claims, 6 Drawing Sheets

OTHER PUBLICATIONS

IBM Tech. Discl. Bull., vol. 36, No. 11, pp. 587–588 (Nov. 1993).

Murtha, A.J., "The Development of a Configuration Control Tool," Software Maintenance, pp. 265–268 (1991).

Hunt et al., "Delta Algorithms: An Empirical Analysis," prior to Jun. 1998.

Hunt et al., "An Empirical Study of Delta Algorithms," prior to Jun. 1998.

MacDonald, "The Design and Implementation of Distributed, Disconnected Operation in PRCS," prior to Jun. 1998.

Reuter et al., "Distributed Revision Control Via the World Wide Web," prior to Jun. 1998.

Hunt et al., "Distributed Configuration Management via Java and the World Wide Web," prior to Jun. 1998.

Hunt et al., "Selected Patterns for Software Configuration Management," prior to Jun. 1998.

Hunt et al., "Compression Comparison: RCE (bdiff) vs. RCS (diff)," Feb. 16, 1998.

Tichy, "The String–to–String Correction Problem with Block Moves," ACM Transactions on Computer Systems, vol. 2, No. 4, pp. 309–321 (Nov. 1984).

* cited by examiner

OLD VERSION FILE

NEW VERSION FILE

PREPROCESSED OLD VERSION FILE

PREPROCESSING A REFERENCE DATA STREAM FOR PATCH GENERATION AND COMPRESSION

FIELD OF THE INVENTION

The present invention relates generally to updating files and streams using a patch, and to compression of files and streams.

BACKGROUND AND SUMMARY OF THE INVENTION

Software application programs commonly are subject to frequent revision and modification, such as for bug fixes and to add new features. It is inconvenient to users and expensive to software venders, however, to distribute and install complete new copies of software application programs each time there is a revision. A more effective alternative is to generate a patch file that details various specific deletions and insertions that will update a previous version copy of the software application program to produce a new version copy. Such a patch file generally is much smaller in size than the complete copy of the new version software application program, and can be more easily and less expensively distributed to and installed on the user's computers, such as via a download from the Internet and use of an automated patch application program.

Data compression also is commonly used to facilitate distribution of files where there is no prior version copy available (e.g., distribution of first version software or data files, or an updated version to new users). One broad classification of data compressors are called "dictionary encoders." (See, e.g., Bell et al., Text Compression 206–243 (1990).) Dictionary encoders encode an input data stream (e.g., a file that is input into the dictionary encoder to be compressed) with respect to some reference data (referred to as the "dictionary"), by matching substrings of the input data stream to strings in the dictionary and encoding the input data stream substrings as references to the matching strings in the dictionary. In one elementary implementation of the dictionary encoder, the dictionary is a compilation in table form of the most frequently occurring strings in the input data stream. The encoded references are simply the index of the matching string in the table. Although the dictionary must typically be included with the resulting compressed data to allow decompression, compression is achieved because the encoded index of a dictionary string is much smaller than its raw or plain text representation.

A well known subclass of dictionary encoder, generally termed LZ encoders (from originating work done by Lempel and Ziv), compresses an input data stream with respect to a preceding portion of the input data stream known as the "history." The data stream is thus effectively its own "dictionary." In general, an exemplary LZ encoder searches the history for a string that matches each next portion of the input data stream. If such a match is found, the LZ encoder encodes the matched next portion of the input data stream using a match code that is a reference (e.g., composed of an offset and length) to the matching string in the history. Otherwise, the LZ encoder encodes a next character of the input data stream as a raw data code or "literal" that designates the character as plain text. The just encoded portion of the input data stream is then added to the history, and will be included in the search to match the next portion of the input data stream. Often, the history is stored in a fixed size, sliding window type history store, from which the oldest data exits as new data from the input data stream is added (thus, the data effectively slides through the window). Accordingly, with these prior LZ encoders, an input data stream is encoded with respect to preceding data in that same input data stream. These LZ encoders achieve compression of the input data stream because the match codes can be much smaller than the substrings that they represent.

In Sliger et al., "Method And System For Updating Software With Smaller Patch Files," U.S. patent application Ser. No. 09/093,591, filed Jun. 8, 1998 (the disclosure of which is incorporated herein by reference) (hereafter referred to as the "Patch Patent Application"), a novel patch system is described that uses a data compressor to generate a patch file for updating a prior version file to a new version file. In one implementation, the history store (which may be the sliding window type) of an LZ encoder is pre-loaded with a prior version of a file. The LZ encoder then commences to compress a new version of the file with respect to the prior version of the file held in the history store. In most cases, the new version of the file will contain much data that is carried over from the prior version. The new version therefore will usually contain many substrings that match substrings of the prior version held in the history store, resulting in highly compressed encoded data. The encoded data is used as a patch file that can be distributed to other computers on which the prior version of the file resides. On such other computers, the new version of the file is reproduced from the patch file using an LZ decoder whose history store also is preloaded with the resident prior version of the file.

A problem common to the above described systems is that the efficacy of both patch generation and compression depends on the degree of similarity between the new and old version files (or between the input data stream and history store). For example, one factor that tends to increase the size of patch files produced by the patch system in the Patch Patent Application is code movement between versions of an executable file. Code movement signifies that some sections or blocks of code within the executable file are moved relative to their locations within the previous version file. Often, there are many instructions (e.g., branch, jump, and function call instructions) in the code of an executable file that reference locations in other code blocks of the executable file as either an offset or absolute location within the file. Such inter-code block references will change if the referenced code block is moved in a new version of the executable file with respect to its location in a prior version. Since program files are a concatenation of many blocks of code, code movement occurs due to the intentional insertion or deletions of data anywhere in the file, and the corresponding changes to location references affect many blocks of code which are otherwise unchanged. When the new version is encoded by the LZ encoder with respect to the previous version, these changed inter-code block references can interrupt matches from code blocks in the new version to otherwise identical code blocks in the prior version of the executable file. As a result, the code block is encoded as several match codes interspersed with literals that encode the changed inter-code block references, instead of as a single match code.

Figure 2:
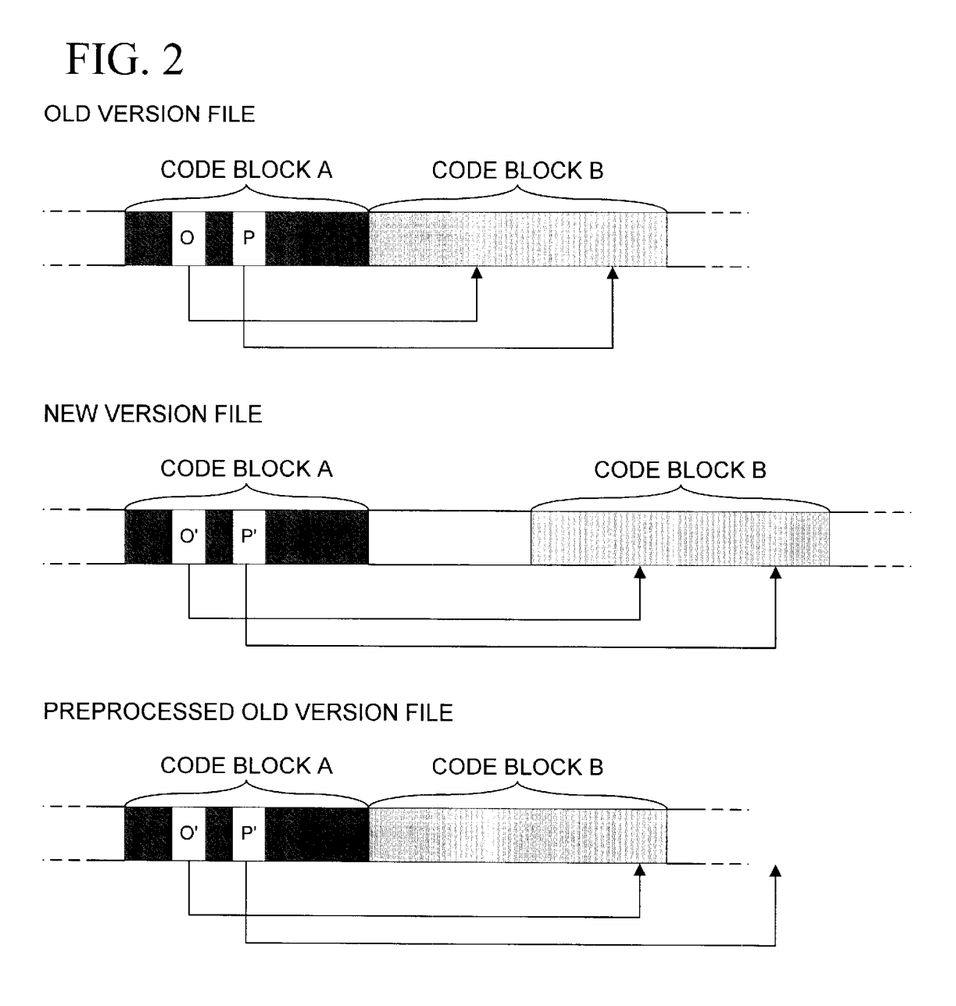
FIG. 2 is a diagram illustrating the effect of code movements between versions of a file on compressing one version of the file with respect to another version.

With reference to FIG. 2 for example, a first code block (A) in an old version of an executable file contains two instructions that reference locations in a second code block (B) by offsets O and P. However, the code block B in a new version of the executable file is shifted relative to its location in the old version, such as may be caused from insertion of new data in between the code blocks A and B. Due to the movement of code block B, the two instructions in code block A of the new version file specify changed offsets O' and P' into the code block B. If the old version file is then loaded into the history store of an LZ encoder as described in the Patch Patent Application, the LZ encoder cannot encode the code block A in the new version as a single match code designating the code block A of the old version held in the history store because the offsets differ between the versions effectively interrupting a continuous match. Instead, the LZ encoder at best (assuming no other changes to code block A) encodes the new version's code block A as three match codes (designating corresponding portions of the old version's code block A that are identical) separated by literals that specify the changed offsets O' and P' in plain text. By causing the offsets in code block A to change, the movement of code block B thus substantially enlarges the size of the patch produced by the above-described process.

The present invention addresses the code movement problem and like obstacles to effective patch generation and compression, by preprocessing a known data stream to be used in patch generation or compression so as to more closely resemble the input data stream. A patch generator or data compressor can produce a smaller patch or compressed data stream since more and/or longer matches between substrings of the input data stream and the preprocessed known data can be found. The known data is identically preprocessed before patch application or decompression to exactly recover the input data stream.

In some implementations, the preprocessing can take the form of predetermined transformations based on data descriptive of relationships between the input data stream and the known data. This descriptive data can include, for example, data describing code movements in an executable file. The transformations based on such descriptive data may include fixing up call instruction references (such as may be identified from import tables, export tables, or relocation tables that are included in the executable file according to many typical executable file formats, or by simply scanning the input data for instruction codes or data which appear to signify position-sensitive values) to account for the code movements indicated by the descriptive data. The descriptive data is stored or sent with the compressed data stream and the same transformations applied deterministically based on the descriptive data at both compression (or patch generation) and decompression (or patch application). The preprocessed executable file likely will not function correctly, as many of its internal references have been mangled, but it will serve as a closer approximation of the new file.

Desirably, the preprocessing based on the descriptive data effects a reduction in size of the patch or compressed data stream. In particular, the combined size of the descriptive data plus the patch or compressed data stream should be smaller than the size of the patch or compressed data stream without preprocessing. Some elements of the descriptive data, however, may not lead to any further reduction in size of the patch or compressed data stream, and may even increase their size. For example, descriptive data of code block movement that does not affect any call instruction references may not produce any further reduction in size of the patch or compressed data stream from the preprocessing. According to another aspect of the invention, such ineffective elements of the descriptive data are discarded. The ineffective elements can be identified, for example, through an iterative process of patch generation or compression after preprocessing with and without individual of the descriptive data elements. Also, the descriptive data is pruned to eliminate duplicative elements.

According to a further aspect of the invention, the preprocessing to be applied to the known data can be determined from iteratively, (1) examining the compressed data produced by a data compressor to identify code movements or other relationships between the input data stream and the known data, (2) producing instructions or descriptive data according to the identified code movements or relationships, (3) preprocessing the known data per the instructions or descriptive data, (4) compressing the input data stream with respect to the preprocessed known data, and (5) comparing the compression achieved to that previously achieved. If the instructions or descriptive data generated in each iteration resulted in improved compression, then the instructions or descriptive data is kept. Otherwise, the instructions or descriptive data are removed as being non-productive.

In at least some implementations of the present invention, the descriptive data utilized in preprocessing can be based on estimates, guesses or other such error-prone information. This is because the patch generation or compression after preprocessing will compensate by encoding any differences of the input data stream from the preprocessed data, whether the differences reflect error introduced during preprocessing or modifications from updating to a new version. Accordingly when combined with patch generation or compression, all modifications made during the preprocessing are effectively self-correcting.

Additional features and advantages of the invention will be made apparent from the following detailed description of an illustrated embodiment which proceeds with reference to the accompanying drawings.

DETAILED DESCRIPTION

The present invention is directed towards preprocessing to improve compression efficiency. In one embodiment illustrated herein, the invention is incorporated into a software updating system 100 (FIG. 2) using a patch file to update software on users' computers. Typically, the patch file is generated on the computer of a vendor of the software, and then distributed to be applied on the users' computers. The patch file can be distributed via a network (e.g., the Internet), or by physical media (e.g., disk).

Exemplary Operating Environment

Figure 1:
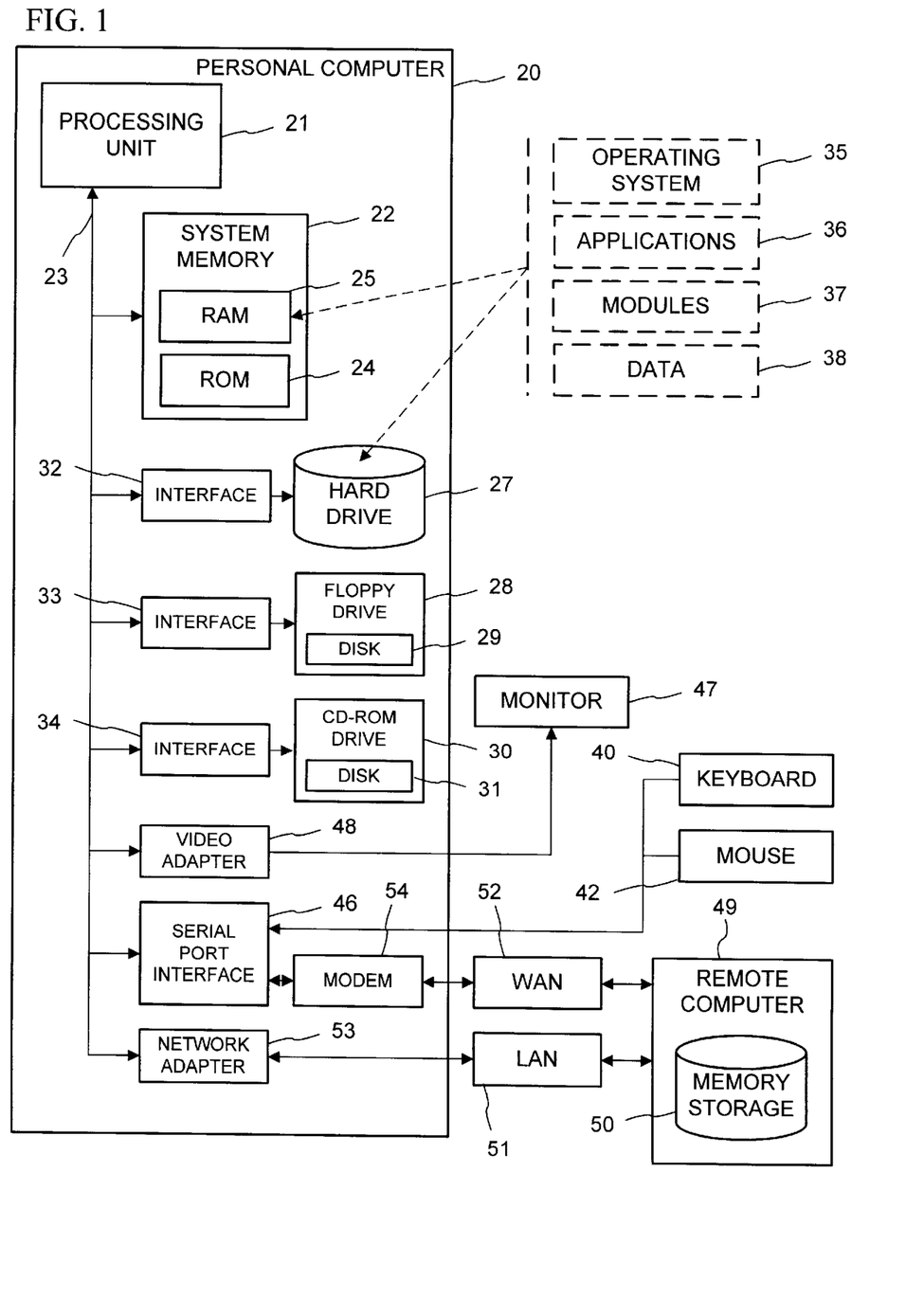
FIG. 1 is a block diagram of a computer system that may be used to implement a method and apparatus embodying the invention for preprocessing to improve compression efficiency.

FIG. 1 and the following discussion provide a brief, general description of computers used in the illustrated embodiment. While the embodiment is described in the general context of computer-executable instructions of computer programs that run on personal computers, those skilled in the art will recognize that the invention also can be implemented in combination with other program modules. Generally, program modules include routines, programs, components, data structures, etc. that perform particular tasks or implement particular abstract data types. Moreover, those skilled in the art will appreciate that the invention can be practiced with other computer configurations, including hand-held devices, multiprocessor systems, microprocessor-based or programmable consumer electronics, minicomputers, mainframe computers, and the like.

With reference to FIG. 1, the computers 20 used in the illustrated embodiment include a processing unit 21, a system memory 22, and a system bus 23 that couples various system components including the system memory to the processing unit 21. The processing unit can be any of various commercially available processors, including Intel x86, Pentium and compatible microprocessors from Intel and others, including Cyrix, AMD and Nexgen; Alpha from Digital; MIPS from MIPS Technology, NEC, IDT, Siemens, and others; and the PowerPC from IBM and Motorola. Dual microprocessors and other multi-processor architectures also can be used as the processing unit 21.

The system bus can be any of several types of bus structure including a memory bus or memory controller, a peripheral bus, and a local bus using any of a variety of conventional bus architectures such as PCI, VESA, Microchannel, ISA and EISA, to name a few. The system memory includes read only memory (ROM) 24 and random access memory (RAM) 25. A basic input/output system (BIOS), containing the basic routines that help to transfer information between elements within the computer 20, such as during start-up, is stored in ROM 24.

The computer 20 further includes a hard disk drive 27, a magnetic disk drive 28, e.g., to read from or write to a removable disk 29, and an optical disk drive 30, e.g., for reading a CD-ROM disk 31 or to read from or write to other optical media. The hard disk drive 27, magnetic disk drive 28, and optical disk drive 30 are connected to the system bus 23 by a hard disk drive interface 32, a magnetic disk drive interface 33, and an optical drive interface 34, respectively. The drives and their associated computer-readable media provide nonvolatile storage of data, data structures, computer-executable instructions, etc. for the computer 20. Although the description of computer-readable media above refers to a hard disk, a removable magnetic disk and a CD, it should be appreciated by those skilled in the art that other types of media which are readable by a computer, such as magnetic cassettes, flash memory cards, digital video disks, Bernoulli cartridges, and the like, can also be used in the exemplary operating environment.

A number of program modules can be stored in the drives and RAM 25, including an operating system 35, one or more application programs 36, other program modules 37, and program data 38.

Illustrated computer 20 operates in a networked environment using logical connections to one or more remote computers, such as a remote computer 49. Remote computer 49 typically includes many or all of the elements described relative to the computer 20, although only a memory storage device 50 has been illustrated in FIG. 1. The logical connections depicted in FIG. 1 include a local area network (LAN) 51 and a wide area network (WAN) 52. Such networking environments are commonplace in offices, enterprise-wide computer networks, intranets and the Internet.

When used in a LAN networking environment, the computer 20 is connected to the local network 51 through a network interface or adapter 53. When used in a WAN networking environment, the computer 20 typically includes a modem 54 or other means for establishing communications over the wide area network 52, such as the Internet. The modem 54, which can be internal or external, is connected to the system bus 23 via the serial port interface 46. In a networked environment, program modules depicted relative to the computer 20, or portions thereof, can be stored in the remote memory storage device. It will be appreciated that the network connections shown are exemplary and other means of establishing a communications link between the computers can be used.

In accordance with the practices of persons skilled in the art of computer programming, the present invention is described below with reference to acts and symbolic representations of operations that are performed by computers 20, unless indicated otherwise. Such acts and operations are sometimes referred to as being computer-executed. It will be appreciated that the acts and symbolically represented operations include the manipulation by the processing unit 21 of electrical signals representing data bits which causes a resulting transformation or reduction of the electrical signal representation, and the maintenance of data bits at memory locations in the memory system (including the system memory 22, hard drive 27, floppy disks 29, and CD-ROM 31 ) to thereby reconfigure or otherwise alter the computer system's operation, as well as other processing of signals. The memory locations where data bits are maintained are physical locations that have particular electrical, magnetic, or optical properties corresponding to the data bits.

Overview of Software Updating System

Figure 3:
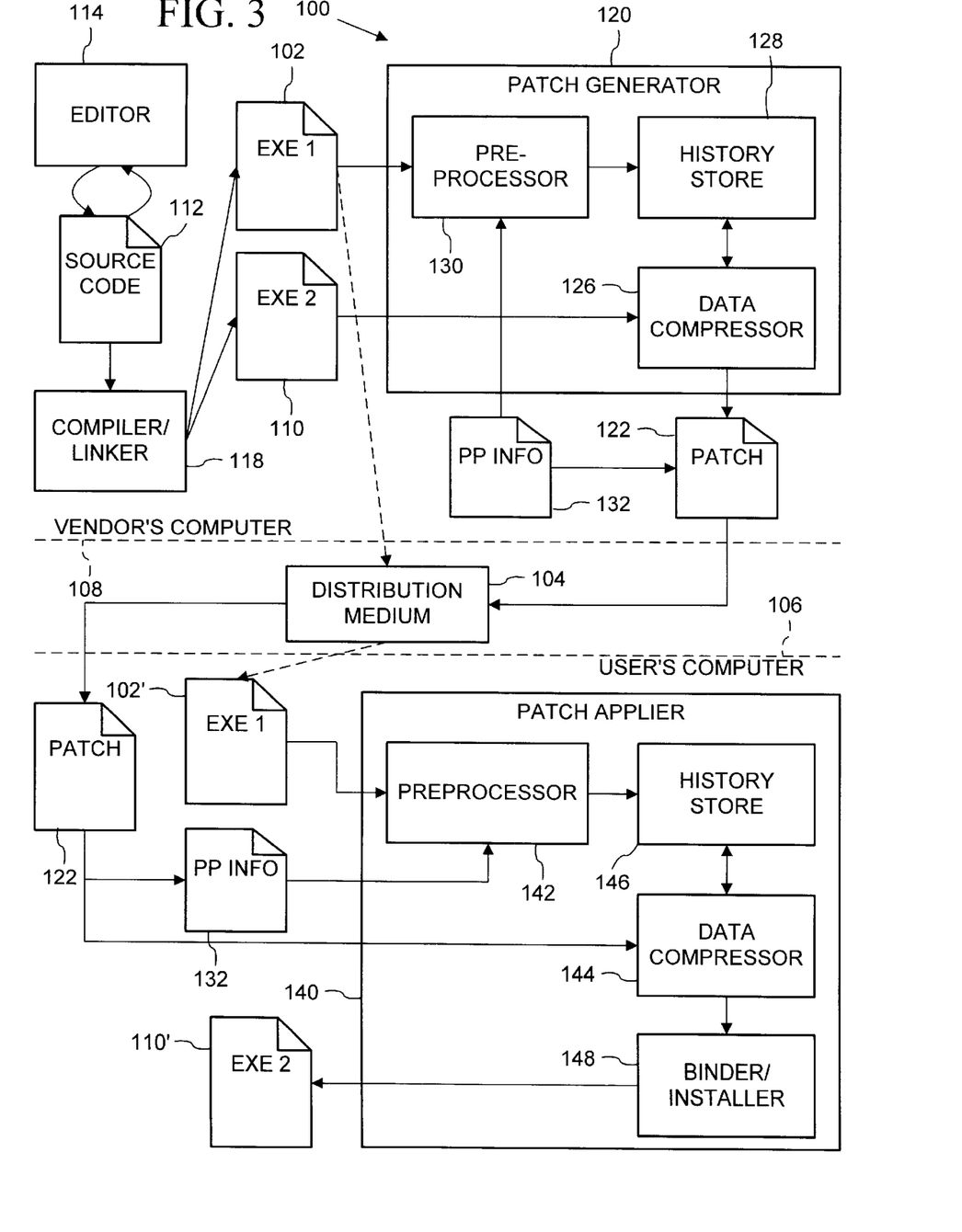
FIG. 3 is a data flow diagram of a software updating system using patches, which incorporates preprocessing to improve compression efficiency according to an illustrated embodiment of the invention.

Turning to FIG. 3, the illustrated software updating system 100 generally is used by a software vendor to update an old version software product (e.g., an old executable file 102, 102') that was previously distributed (e.g., via a distribution medium 104) and installed on a potentially very large number of users' computers (e.g., a user's computer 106). The update may, for example, provide bug fixes or add subsequently developed features that were not available in the old version. Since current software products often include very large size files, it is preferable that the update be made by distributing a relatively small file referred to as a "patch" that can reconstruct a new version of the software from the old version.

In the case of updating the executable file 102, the software vendor at a computer 108 produces a new version of the executable file (new executable file 110) per conventional techniques, such as by editing a source code 112 (i.e., the source code from which the old version executable file 102 was produced) using a text editor or like editing tool 114 and then compiling and linking the edited source code 112 using a compiler and linker 118 to produce the new executable file 110. The resulting new executable file 110 will differ in a few or many respects from the old executable file depending on the changes made, but will also have some portions carried over from the old executable file 102.

The vendor produces a patch 122 for updating the distributed old executable file 102' on the user's computer 106 by inputting the old and new executable files 102, 110 to a patch generator 120 on the vendor's computer 108. The illustrated patch generator 120 is of the type described in the Patch Patent Application that includes a data compressor 126 having a history store 128, and further includes a preprocessor 130 according to the present invention. As described in the Patch Patent application, the illustrated patch generator 120 uses the data compressor 126 to produce the patch 122 by pre-loading the old executable file into the history store 128 of the data compressor, and then compressing the new executable file 110 with the data compressor as described in the above referenced Patch Patent Application. The result is the patch 122 that is much smaller than the new executable file 110, and can be decompressed using the old executable file 102 on a separate computer to reproduce the new executable file 110.

Alternatively, the preprocessor 130 can be used with other type patch generators (such as conventional patch generators using insertion/deletion encoding), or with other type stream processing engines that encode an input file or stream with respect to a reference file or stream (such as a Reed-Solomon type encoder or other error correction engine).

The data compressor 126 preferably uses a variety of LZ encoder known as LZX data compression which is available from Microsoft Corporation, and uses a searching technique for identifying matches within the history window that is described in a pending U.S. patent application Ser. No. 08/783,491, filed Jan. 14, 1997 (the disclosure of which is incorporated herein by reference). The LZX data compression is particularly useful because it supports a very large size of history store 128 (such as, 8 or 16 Megabytes), and can compactly encode matches at very large frequently recurring offsets into the history store. The data compressor 126 alternatively can use other forms of data compression where an input data stream is encoded with respect to some reference data, such as other type LZ encoders and dictionary-based compressors. Various suitable LZ encoders are described in Bell et al., Text Compression (1990), and in Microsoft's U.S. Pat. Nos. 5,572,206; 5,521,597; and 5,455, 577 (the disclosures of these patents are incorporated herein by reference); and also may include the data compression techniques known as LZ77 (for Lempel/Ziv's original 1977 paper), LZR (Rodeh's 1981 implementation), LZSS (Bell's 1986 implementation), LZB (Bell's 1987 implementation), and LZH (Brent's 1987 implementation).

In accordance with the present invention, the preprocessor 130 in the patch generator 120 processes the old executable file 102 in accordance with preprocessing information 132 prior to loading into the history store 128 so that the old executable file 102 more closely resembles the new executable file 110. The processing of the executable file can include modifying jump and call instruction references to locations in moved sections of code to prevent match interruptions (which are discussed in the Background and Summary of the Invention above with reference to FIG. 2), relocating sections, and other transformations discussed more fully below. This preprocessing allows the data compressor 120 to identify more and/or longer matches of sub-string portions of the new executable file 110 to strings of the preprocessed old executable file in the history store 128, which results in an even smaller (i.e., more compressed) patch 122. The preprocessing information 132 is included in or with the patch 122 to allow the same preprocessing to be performed on the user's computer 106 on application of the patch. The illustrated patch 122 includes a header section, preprocessing information table, and the compressed data stream output from the data compressor 126. One of the preprocessing information table or the compressed data stream optionally may be null in a particular patch instance.

The patch 122, being of a smaller size than the new executable file 110, can be more easily distributed by the vendor via the distribution medium 104 to the users of the old executable file (in comparison to distributing the new executable file 110). For example, where the distribution medium is a communications network, the smaller size of the patch 122 reduces the transmission time and/or communications bandwidth required to distribute updates to the users' computers. Where the distribution medium is a disk or other physical data storage medium, a smaller capacity or fewer disks can be used, or additional other data can be distributed with the patch on the disk.

At the user's computer 106, the user updates the old executable file 102' (that was previously distributed and installed on the user's computer 106) with the newly distributed patch 122' using a patch applier 140. The patch applier 140 includes a preprocessor 142, a data decompressor 144 with a history store 146, and a binder/installer 148. The preprocessor 142 processes the old executable file 102' in a same manner as the preprocessor 130 processed the old executable file 102 on the vendor's computer 108 so as to load the history store 146 of the data decompressor 144 with preprocessed old executable file data identical to that loaded in the history store 128 when the patch 122 was produced by the patch generator 120. As discussed in the above-referenced Patch Patent Application, the patch generator 120 and patch applier 140 may additionally apply normalizing transformations to the old executable file prior to preprocessing and/or loading in the history stores 128, 146 to account for installation-specific modifications that may have been made to the old executable file 102' on the user's computer.

With the preprocessed old executable file 102' loaded into the history store 146, the data decompressor 144 decodes the patch 122' in a reverse of the encoding process performed in the data compressor 126 so as to exactly reconstruct the new executable file 110'. The binder/installer 148 completes the updating process, by installing the new executable file 110' on the user's computer 106.

Preprocessing

In the illustrated software updating system 100 of FIG. 3, the preprocessing performed by the preprocessors 130, 142 takes the form of modifying location references (e.g., offsets or addresses) in relative jump and call instructions of the old executable file 102, 102' that may be changed due to code movement in the new executable file 110. The preprocessing also can include other modifications that tend to make the old executable file 102 more closely resemble the new executable file 110 and thereby reduce the size of the patch 122 produced by the data compressor 126. Often, the kinds of modifications appropriate for preprocessing depend on the file format of the file being updated. For example, modifying location references in relative jump and call instructions is particularly appropriate to executable files. In the case of help files, or other textual or multi-media documents having internal cross-references such as hyperlinks, the preprocessing can take the form of modifying the internal cross references between sections or like portions of the files or documents to more closely resemble a new version of the file or document. Particular other types of preprocessing may be appropriate to other file formats.

As discussed above, the particular modifications made to the old executable file 102, 102' during preprocessing are made in accordance with the preprocessing information 132. The preprocessing information 132 in some embodiments of the invention takes the form of information that describes relationships between the old executable file 102 and new executable file 110, such as changes in the layout of the files or locations of blocks within the files. The preprocessor 130, 142 then performs predetermined transformations to the old executable file 102, 102' based on the preprocessing information. For example, the preprocessing information 132 can specify movements of code and/or data blocks between the old and new executable files 102, 110. Based on the specified block movements, the preprocessor 130 can modify jump and call instruction references to locations in the moved blocks so as to reflect the blocks' movements.

An exemplary form of this preprocessing information 132 is a list (also referred to as a "rift table") that identifies the block movements by block starting position in one of the old or new executable files and the change in the block's position (i.e., a block's displacement) between the old and new executable files. Thus, for the moved code block B in the old and new version files shown in FIG. 2, the exemplary preprocessing information lists code block B's starting position in the old executable file, and its change in position between the old and new version files. Alternatively, the preprocessing information 132 can list the block movements by each block's respective starting positions in the files. Since each insertion or deletion from the old executable file 102 affects all subsequent blocks, it is not necessary to identify the position of every block that has been moved. If the list is sorted by file position, it is then sufficient to identify only those blocks where a change in the displacement occurs. The preprocessor can infer that all intervening positions will experience the same displacement until a different displacement is specified. The illustrated preprocessing information 132 identifies the position in the files as a virtual memory address, however the file offset or other indication of location within the file can be used.

An example of this form of the preprocessing information is shown in the following Table 1. The first column list block positions in the old executable file, while the second column lists the block positions in the new executable file. In this example, the first row of the list indicates the position of a first block remains unchanged (at a file offset 40000) between the old and new executable files 102, 110. The second row indicates a second block is shifted by 2000 bytes due to an insertion between the first and second blocks. The third row indicates a third block is shifted in the other direction by 700 bytes due to a deletion. From this information, it can be inferred that the size of the first block is 1000 bytes, while the second block is 2800 bytes.

TABLE 1

| 40000 | 0 |
| 41000 | 2000 |
| 44500 | 1300 |

During preprocessing the old version file (FIG. 2), the preprocessor 130 identifies each location reference, such as jump or call instructions or pointers, within or referring to the moved block(s) specified by the exemplary preprocessing information, and modifies such location references so that the adjusted numeric value will match the corresponding location references in the new file, which will refer to the respective code block in its moved position.

For absolute location references, the preprocessor computes the magnitude of each correction needed using the difference between the target's old and new positions, $\delta = B' - B$. For relative location references, the preprocessor must also take any change in the referring block's position into account, $\delta = (B'-B)-(A'-A)$. Thus, if block A contains a relative reference to block B, a correction will be needed even when block B did not move but block A did move. Similar arithmetic would be used for hybrid or other kinds of references, such as displacements encoded using different position units or where position rounding is used. An example would be where a file's header includes the size of the code section, rounded up and specified as the number of virtual memory pages occupied.

The preprocessor 130 identifies these location references using a variety of techniques that depend upon the format of the file being processed. For example, executable files that conform to the Microsoft Portable Executable and Common Object File Format Specification 4.1, MSDN library (1996) include a ".reloc" section that lists the location of all absolute location references in the executable file to allow adjustment of the references by a linker or loader. For each reference listed in the relocation table that refers to a location in a moved block, the preprocessor 130 modifies the reference by the change in the moved block's position between the old and new version files. Thus, for the old version file in FIG. 2, if the O and P references were absolute reference into block B, the preprocessor would find the positions of O and P in code block A listed as absolute references in the old version file's relocation table. These locations would refer to locations in the code block B that is listed as moving in the exemplary preprocessing information 132. Accordingly, the preprocessor 130 modifies the absolute references O, P by the change in position of the code block B listed in the preprocessing information 132. The modified values O', P' in the preprocessed old version file will then no longer differ numerically from those in the new version file, allowing the data compressor 136 to encode the entire code block A as a single match code. The preprocessor 130 also transforms the relocation table itself, adjusting the entries which reference into any moved blocks, making the transformed relocation table in the preprocessed file more similar to the new file's relocation table.

In addition, the preprocessor can determine the locations containing offsets or absolute references to moved blocks using any known information about the structure of the file. Nearly all file formats include some form of a header which points out various elements contained in the file. Executable files may contain external import symbols, debug information, and object code. The object code may be analyzed or disassembled to ascertain the locations of references which need to be corrected, and how those references are used. Many files contain tables, lists, or similar structures which can be adjusted to compensate for the movement of blocks or the insertion or deletion of preceding data.

More particularly, the illustrated preprocessor 130 scans the old executable file 102 for any occurrences of instruction byte codes for jump or call instructions (e.g., the E8 instruction code for a call instruction in the Intel x86 microprocessor instruction set) which are followed by operand bytes that have the appearance of an address or relative offset reference (e.g., the bytes in the appropriate location of a reference operand of such instructions would specify a valid reference to a location within the file). The preprocessor 130 may misidentify some bytes of the old executable file 102 as being references, and erroneously transform the misidentified bytes. However, these changes will be corrected during patch generation by the data compressor 126 and consequently patch application by the data decompressor 144 to nevertheless properly reconstruct the new executable file 110. In an alternative embodiment, the preprocessor 130 can employ a disassembler that fully disassembles the old executable file 102 to correctly identify all references.

In addition to information specifying block movements, the preprocessing information 132 can include other types of information useful to the preprocessor. For example, the preprocessing information 132 can include information identifying which portions of the executable files are code and which are data. This information can be encoded, for example, as a bitmap with one bit per block to indicate whether it is code or data. During preprocessing, the preprocessor uses this information to determine whether to scan the block for possible jump and call instruction references and thus avoid misidentifying and transforming bytes in a data block.

The illustrated preprocessor 130 transforms code block references in the old executable file 102 in accordance with the block movements specified in the preprocessing information without actually moving the blocks themselves. Instead, the movement of the blocks between their positions in the old and new files is effected by the match codes output by the data compressor 126. In some alternative embodiments, the preprocessor 130 can additionally move blocks of the old executable file in accordance with the movements specified in the preprocessing information 132, which may effect a further reduction in the size of the patch data.

For preprocessing utilizing the exemplary preprocessing information described above, only the movement of blocks is explicitly supplied. The preprocessor 130 infers the position of other bytes (such as inter-block references) that need to be corrected, and computes the magnitude of each correction needed. This preprocessing information has the advantage that it usually is more compact than if the corrections are made by the data compressor 126 that would explicitly identify specific individual modifications to the old executable file 102. For example, the preprocessing information specifying a single block movement may be the basis for the preprocessor transforming many jump and call instruction references. The preprocessing information for the single code block movement usually is more compact than separately coding the individual reference corrections as literals in the output of the data compressor 126. The preprocessing information thus can be used to produce a smaller patch 122.

Preprocessing Information Generation

The preprocessing information 132 in the illustrated system 100 (FIG. 3) is created by an operator of the patch generator 120 through empirical observations of the relationships (e.g., code block movements) between the old and new executable files 102, 110, and/or with the aid of automated tools. For example, the operator can identify movement of blocks of code and/or data between the old and new executable files 102, 110 from the match codes output by the data compressor 126. More specifically, when compressing the new executable file with the old executable file preloaded in the history store, the data compressor 126 outputs a stream of match codes and literals. The match codes indicate which portions of the old executable file match portions of the new executable file, such as by offset to the matching portion of the old executable file in the history store 128. Code block movements between the old and new executable files cause shifts in the offsets of the match codes in the compressed output stream. For example, with the (not preprocessed) old version file (FIG. 2) loaded into the history store 128, the data compressor 126 will encode code block A of the new version file (FIG. 2) as three match codes all having identical offsets into the history store 128. However, due to the changed position of the code block B in the new version file, the match code that encodes the code block B will have a different offset into the history store. Thus, based on such shifts in the match code offsets, the code block movements between the executable files can be identified for use as the preprocessing information 132.

Figure 4:
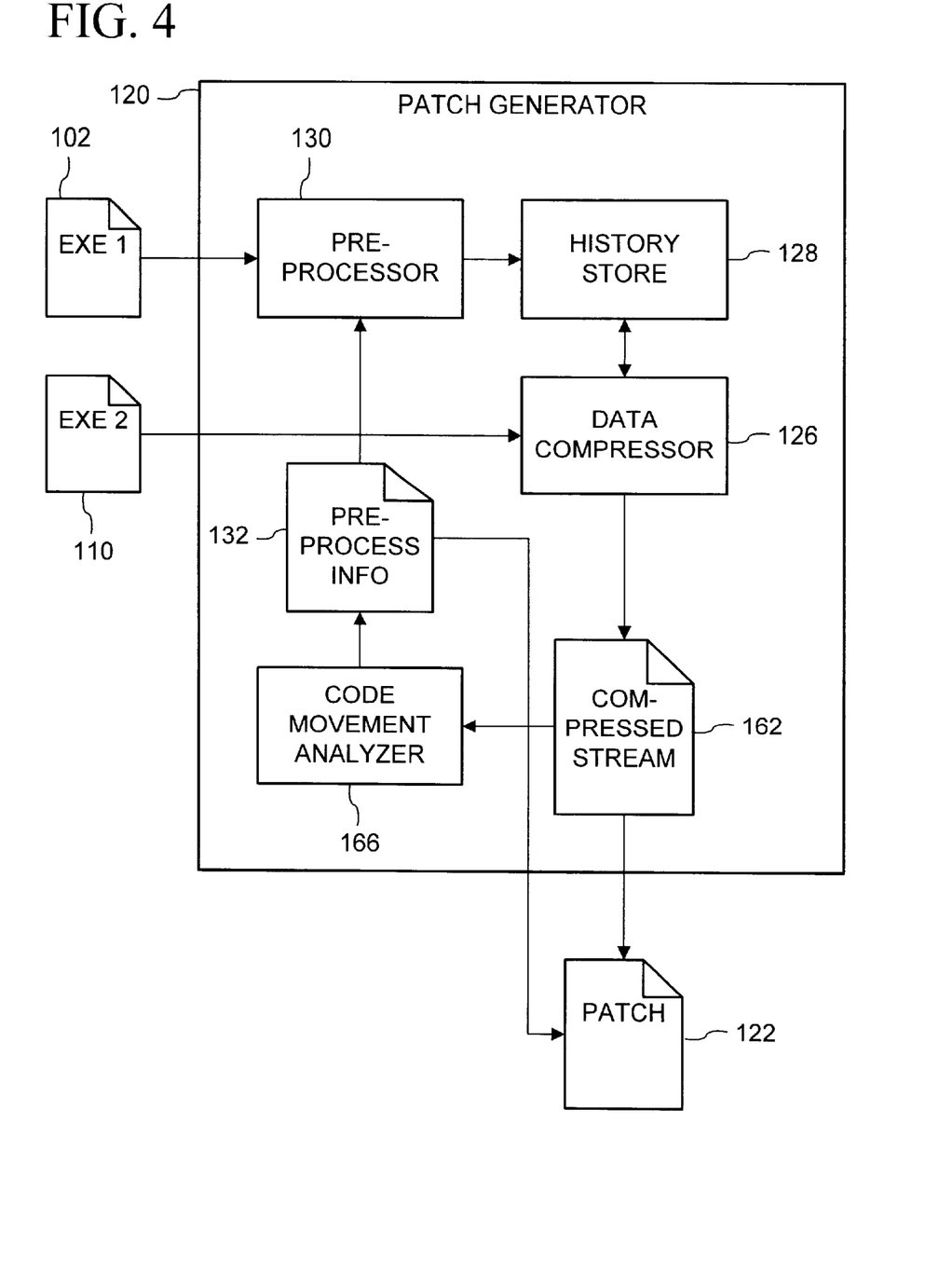
FIG. 4 is a data flow diagram of a process to produce preprocessing information for the preprocessing in the software updating system of FIG. 3.
Figure 5:
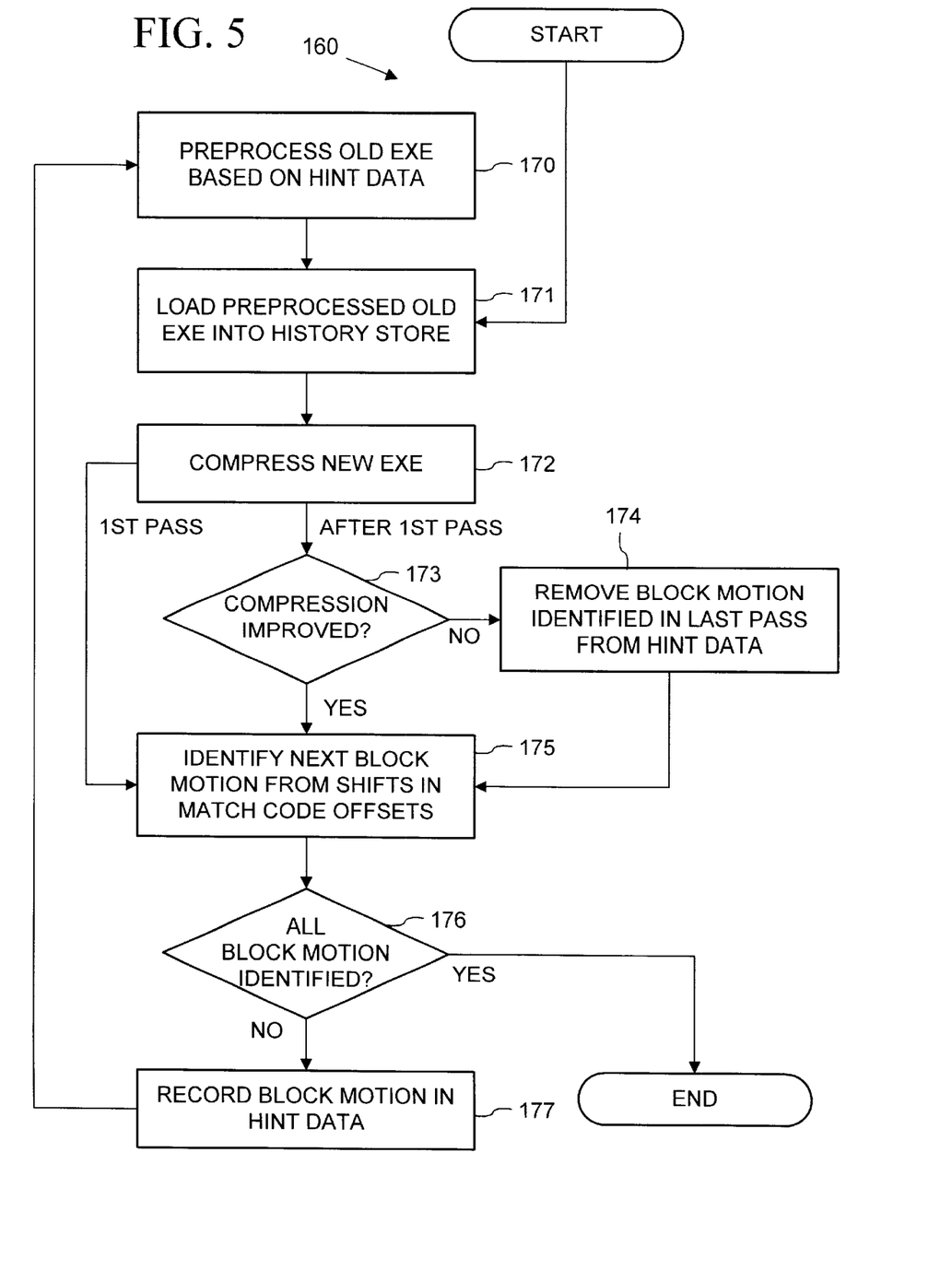
FIG. 5 is a flow chart of the process to produce preprocessing information in FIG. 4.

With reference now to FIGS. 4 and 5, the preprocessing information 132 is generated in an illustrated process 160 (FIG. 5) by analyzing a compressed stream 162 output by the data compressor 126 to identify code block movements between the old and new executable files 102, 110. The analysis of the compressed output stream in the process 160 can be done manually by the operator, or as an automated computer program (a code movement analyzer 166 shown in FIG. 4).

In a first pass, the process 160 (FIG. 5) starts by loading the old executable file 102 into the history store 128 (FIG. 4) at a step 171 (FIG. 5). Since no preprocessing information 132 has yet been generated in this first pass, the old executable file is loaded into the history store without preprocessing. At a next step 172 (FIG. 5), the data compressor 126 (FIG. 4) compresses the new executable file 110, producing the compressed stream 162 (FIG. 4). This first pass can include preprocessing which forces the numeric values of all location references to deterministic values (constants, valued derived from adjacent locations, etc.). This will allow the compressor to locate blocks which match except for location references, producing more accurate block movement information.

Next in the process 160, the code movement analyzer 166 (FIG. 4) analyzes the compressed stream 162 output from the data compressor 126 to identify a block that has moved between the old and new executable files 102, 110 (i.e., a next "block motion"). The code movement analyzer 166 identifies the block motion by traversing the compressed stream 162 to detect any shifts in the match code offsets that point to matching portions of the old executable file held in the history store, as described above. The encoded match lengths can be used to bias potentially conflicting block movement deductions. If no further block motion is found, the process 160 ends as indicated at a step 176. Otherwise, the next block motion found based on the compressed stream 162 is recorded in the preprocessing information 132.

After the first pass completes, the process 160 repeats additional passes or iterations of the steps 170–177 (FIG. 5). In the subsequent passes, the preprocessor 130 (FIG. 4) first preprocesses the old executable file 102 based on the preprocessing information generated up to that point at a step 170 (FIG. 5). The preprocessed old executable file is loaded into the history store 128 (FIG. 4) at the step 171 (FIG. 5), and the data compressor 126 (FIG. 4) again compresses the new executable file 110 to produce the compressed stream 162 (FIG. 4).

After the new executable file is compressed in the subsequent passes, the amount of compression (i.e., reduction in size of the compressed stream relative to the new executable file) in the current pass is compared to that achieved in the last pass. This comparison is done to determine whether the preprocessing information added in the last pass improved the compression. Since the preprocessing information is added to the patch, each piece of preprocessing information must reduce the size of the compressed stream by at least the size of the added preprocessing information to improve compression. If compression is not improved, the block motion added to the preprocessing information in the last pass is removed as indicated in steps 173–174. Otherwise, the last added block motion is retained.

The process 160 then continues at steps 176–177 by again identifying any next block motion from the compressed data, and either recording the next block motion in the preprocessing information at step 177 or ending the process if no more block motion is found at step 176.

By incrementally adding block motion to the preprocessing information and comparing the resulting compression in multiple passes, the illustrated hint generation process 160 can filter out any block movement information from the preprocessing information that does not improve compression. However, although illustrated as a multiple pass process, the preprocessing information generation process 160 can alternatively be implemented to identify block movements from the compressed stream in a single iteration.

Figure 6:
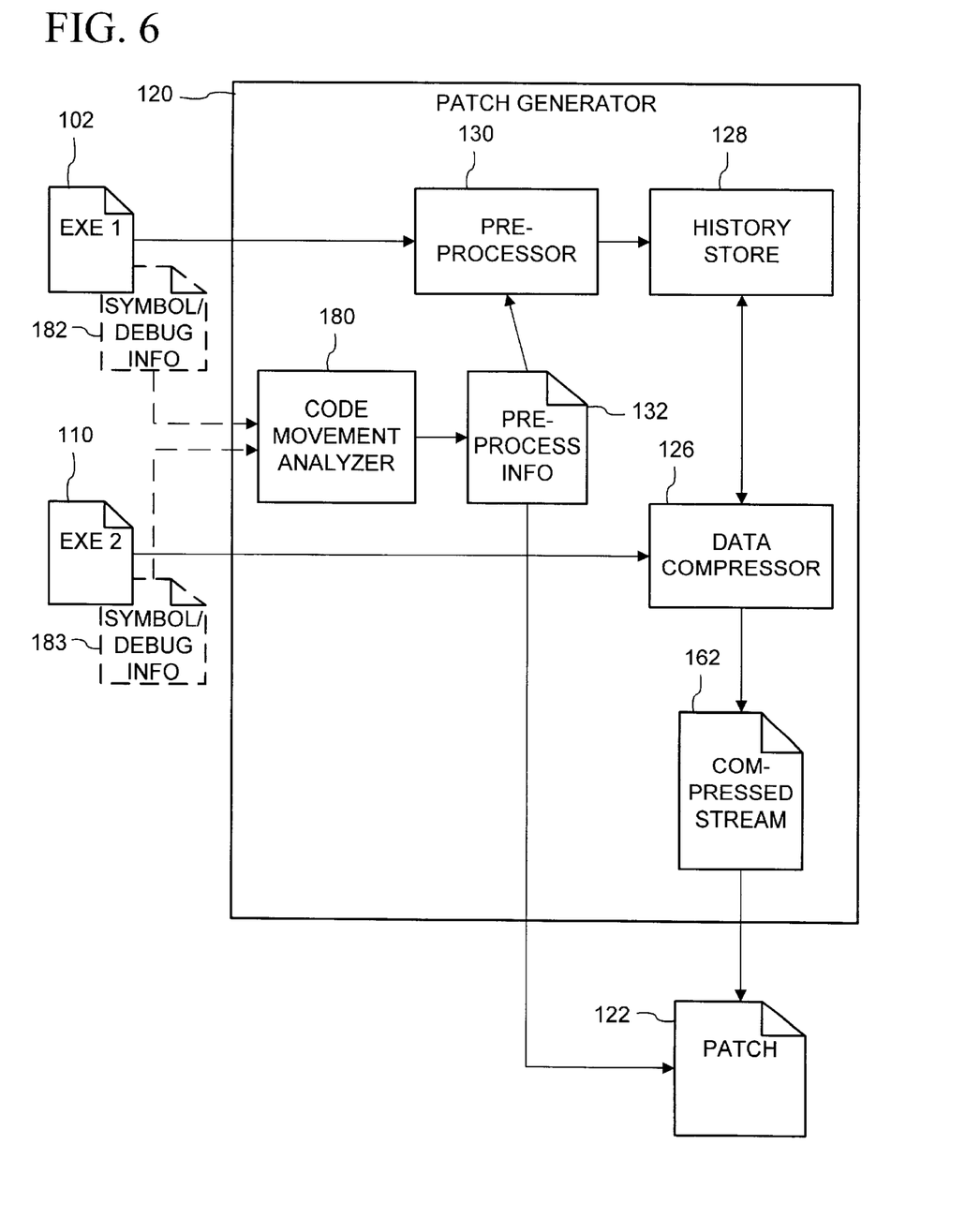
FIG. 6 is a data flow diagram of an alternative process to produce preprocessing information for the preprocessing in the software updating system of FIG. 3.

With reference to FIG. 6, an alternative automated process to produce the preprocessing information 132 uses block location information 182–183 (i.e., information from which block locations are specified or can be inferred) resulting from the production process (e.g., editing, compilation, linking) of the executable files 102, 110 to identify block movements between the executable files. For example, the block location information 182–183 can be symbolic debug information (e.g., symbol tables) generated by a compiler of the executable files 102, 110, which records locations in the executable files for program constructs corresponding to various symbols. Other sources of block location information 182–183 include linker maps, version and change control logs, development histories, and other developer supplied information.

A code movement analyzer 180 in this alternative implementation scans the symbolic debug information 182–183 to obtain the symbol names and positions in the files. The code movement analyzer 180 matches the symbols' names from the old file 102 up to the names from the new file 110, and subtracts their positions in the files to yield a comprehensive list of each of the old executable file's blocks and their relative displacement in the new file. In cases where there are multiple symbol name matches, the code movement analyzer 180 can resolve the conflict using various conflict resolution techniques, such as a greedy-type algorithm that simply matches the symbol names according to their order of appearance in the symbolic debug information 182–183, or by comparing the contents of the old and new file at the indicated locations to determine which most closely match.

If the block location information is sufficiently complete, the code movement analyzer 180 can derive the optimal preprocessing information in one or a few passes. Alternatively, the code movement analyzer 180 can iteratively test individual block movement information in a manner similar to the process 160 of FIG. 5 to eliminate information that is not effective in reducing patch size. The code movement analyzer 180 can further utilize source file editing records to match symbols whose names were changed between versions.

In generating the preprocessing information 132, the code movement analyzer 180 preferably filters or "prunes" duplicative or unnecessary block movement information. Where the scan of the block location information 182–183 yields the example block movement information shown in the following Table 2 for example, the code movement analyzer 180 discards successive list entries that specify displacements identical to a preceding (or succeeding) entry, or entries specifying a displacement of zero. Thus, the code movement analyzer 180 would discard the first, second and fifth entries from the list in Table 2.

TABLE 2

| | |
|---|---|
| 41000 | 2000 |
| 44500 | 1300 |

The code movement analyzer can further filter the preprocessing information according to further criteria to eliminate unneeded entries, such as entries that do not yield improved compressed (more particularly, those entries that do not yield sufficient improvement in compression to offset the additional size of the patch contributed by the entry), and those entries that can be inferred from the matches in the compressed data stream 162.

Also, to further reduce the size of the patch, the preprocessing information 132 preferably is compressed prior to distribution in the patch 122, such as by huffman or other type encoding.

In yet another alternative implementation, the code movement analyzer 180 identifies block movement by scanning the old and new executable files 102, 110 to detect jump and call instructions that contain references to locations in other blocks. The code movement analyzer 180 uses these references to infer movement of the blocks. The code movement analyzer 180 compiles a list of block locations from the locations specified in the instruction references of each file. The code movement analyzer 180 then correlates the blocks in the two files' lists, and calculates the displacement of the blocks between the files to yield the preprocessing information 132.

Having described and illustrated the principles of our invention with reference to an illustrated embodiment, it will be recognized that the illustrated embodiment can be modified in arrangement and detail without departing from such principles.

For example, while the invention has been illustrated with reference to a software updating or patch system, it will be recognized that preprocessing can be applied to improve compression in other contexts where known data is preloaded into a data compressor's history store (or other dictionary). In more general data compression contexts, any data known to exist on another computer where the data is to be transferred can be used to preload the history store after preprocessing according to the invention. More particularly, in the case where a vendor is distributing a first version application program having no counterpart earlier version installed on users' computers, the vendor can nonetheless gain substantial compression efficiencies by preprocessing and preloading other data known to exist on the users' computers into the history store (or other dictionary) of a data compressor. For example, many application programs for the Microsoft Windows operating system have a significant portion of code that is common to other Windows applications, or may include code from standard code libraries (e.g., the Microsoft Foundation Classes). Moreover, versions of the Microsoft Windows operating system include many of these application programs, such as Solitaire (SOL.EXE), Write (WRITE.EXE), Internet Explorer, etc. Depending on the type of application code that the vendor wishes to distribute, different of these known files or alternatively a combination of multiple of these known files can be preprocessed and preloaded to improve compression of the vendor's application.

Naturally, the precise contents of a user's operating system and application files depend on the particular version and "build" of the operating system and applications that are installed on the user's computer. Accordingly, care must be taken when presuming knowledge about files already available on the user's computer. However, even though operating system files change from one version to the next, much of the code is consistent throughout all versions of an operating system. Such known-stable segments of code—often excerpted from larger files—can be preprocessed and preloaded into the history store for use in compression/decompression.

Particularly in contexts where the user's computer has no older version of the same file being installed, it can be desirable to preload the history store with plural files (or file excerpts) from the operating system, rather than just one, reasoning that the larger the dictionary, the greater the probability of matches and the smaller the resulting patch file. ("Patch file" may suggest that an older version of the file is present and is being updated, but as used herein it also refers to a file that generates a brand new file.)

Generally speaking, if processing a *.EXE file, it is desirable to preload one or more *.EXE files into the compression dictionary. Similarly, if processing a *.HLP file, other *.HLP files are good choices for dictionary preloading. Ditto *.DLL files.

While the invention has been described as employing stand-alone compression and decompression processes, such functionality can be integrated into a more comprehensive set of programs, such as an operating system update utility, or a web-based software installation applet. It can also be desirable to provide the component parts of the described functionality as operating system services, available through a family of file patching APIs (application programming interfaces).

While the invention has been described in the context of updating a single file, it will be obvious to those skilled in the art can advantageously be applied to updating a group of files, such as may be associated with an application program or operating system.

Although the disclosure has focused on core processes, such as generating the update data and generating the updated file using same, it will be recognized that numerous known ancillary processes can be used in conjunction therewith. For example, the raw update data can be assembled into a self-extracting patch file. Execution of such a file on the user's computer can: specify the file to be updated, load that file from the user's hard disk into memory, normalize and preprocess the file preparatory to updating, implement a software decompressor, apply the update data to the software decompressor, and take the resulting file data and store it on the user's disk, or initiate any appropriate installation procedure.

While the illustrated system 100 has been described as employing the LZX encoder having a history store of fixed-size, sliding window type, those skilled in the art will recognize that the same principles can likewise be applied to systems in which the history window grows.

Similarly, while the invention has been described with use of LZ encoders, the principles thereof are equally applicable to other dictionary data compression technologies that compress input data with respect to some reference data and particularly to those in which a dictionary is updated in accordance with processed data to aid in identifying redundancies.

While the invention has been illustrated in the context of providing a newer version of software to a user's computer, there are situations in which it is sometimes necessary to regress and replace a newer version with an older version. The same process can naturally be used, by preloading the newer version of the software in the history window and compressing the older version, etc.

While the illustrated system 100 has been described as involving the updating and compression of files, the patching and compressing according to the invention can be applied to other streams of data than only files or portions of files, including for example, a sequence of network packets or sequence of key strokes.

It also should be understood that the programs, processes, or methods described herein are not related or limited to any particular type of computer apparatus, unless indicated otherwise. Various types of general purpose or specialized computer apparatus may be used with or perform operations in accordance with the teachings described herein. Elements of the illustrated embodiment shown in software may be implemented in hardware and vice versa.

Although an illustrated embodiment of the invention has been described as operating on "files," it should be understood that the preprocessing, data compression and patch generation according to the invention also can be done on other streams of data, without regard to whether the stream exists only in memory or is stored in a file system. Further, although streams generally are conceptually composed of bytes or characters, embodiments of the invention can operate on any varieties of streams regardless of character set or character size, whether a fixed number of bits per character or variable, and regardless of the type of encoding used. The invention also is applicable to streams irrespective of their contents, whether static or streaming data, executable code, multimedia content, etc. In the embodiments for these different structures of streams, the preprocessor is programmed to appropriately transform a particular structure of stream according to the preprocessing information. In some implementations, the preprocessor can identify the structure of the stream automatically (e.g., via file name extension, header or identification information, or identifiable bit pattern or signature), while other implementations of the preprocessor may have the user or operator explicitly specify the stream's structure. In one alternative embodiment, the patch 122 can include a bit or bits to indicate which of several varieties of preprocessor (applicable to particular varieties or structures of the files and streams) is to be used by the patch applier 140 (FIG. 3), or even whether to use a preprocessor at all.

Additionally, although an illustrated embodiment of the invention has been described in the context of updating versions of a file, it should be understood that the invention is applicable to any differing representations of files and other streams, without regard for the file's assigned version or revision level or the magnitude or significance of the changes made. Preprocessing according to the invention also has application regardless of the order in which the files and other streams were distributed, sent, arrived, or became available. For example, preprocessing according to the invention is equally well applicable when the old version file and the patch are distributed together or simultaneously. In alternative embodiments, the various operations and processes depicted as occurring in a particular flow or on different or distant computers can be performed earlier, later or at the same times, or in the same or nearby computers, such as when implemented on various multi-tasking, parallel, distributed or other multi-processing computing architectures. The patch applier can operate on a stream in place, or operate on a copy of the stream.

Although depicted as a component of the illustrated patching system, it should also be understood that the preprocessor of the present invention may be tightly integrated with the patch generator and patch applier (or data compressor and decompressor), or may be implemented as a separate program. In particular, it is contemplated that the preprocessor can be used in combination with existing patching products. For example, although illustrated in the patching system using an LZ encoder as disclosed in the Patch Patent Application, the preprocessor can be used in combination with conventional patch generators and other data compressors.

It should also be understood that depending on the files or streams being patched or compressed, there may be no useful preprocessing information generated. Conversely, particularly where the preprocessor moves blocks as well as fixing references according to block movements specified in the preprocessing information, the preprocessing alone may be sufficient to render the resulting stream or file without further patching or data compression. Thus, either the preprocessing information or the information generated by the patch generator or data compressor may be omitted in some circumstances.

In view of the many possible embodiments to which the principles of our invention may be applied, it should be recognized that the detailed embodiments are illustrative only and should not be taken as limiting the scope of our invention. Rather, we claim as our invention all such embodiments as may come within the scope and spirit of the following claims and equivalents thereto.

We claim:

1. A method of compressing an input data stream for distribution to a destination computer, comprising:

analyzing relationships of a reference data stream known to exist on the destination computer to the input data stream;

generating a set of preprocessor-driving information based on the relationships;

deterministically preprocessing the reference data stream based on the preprocessor-driving information; and encoding portions of the input data stream as codes that reference matching portions of the preprocessed reference data stream; and forming a compressed data stream from the codes.

2. The method of claim 1 further comprising:

distributing the compressed data stream along with the preprocessor-driving information to the destination computer;

deterministically preprocessing a data stream resident on the destination computer based on the preprocessor-driving information; and decoding the input data stream from the compressed data stream by retrieving portions of the preprocessed, destination computer-resident data stream that are referenced by the codes in the compressed data stream.

3. The method of claim 1 wherein the step of analyzing relationships comprises identifying movements in position between the reference data stream and the input data stream of blocks that appear in both the input data stream and the reference data stream.

4. The method of claim 3 wherein the step of generating the preprocessor-driving information comprises generating a block motion list that specifies the blocks and their movements in position.

5. The method of claim 4 wherein the step of preprocessing comprises:

identifying internal references in the reference data stream that refer to locations in the blocks specified in the block motion list; and modifying the identified internal references in the reference data stream according to the movements in position of the respective blocks.

6. The method of claim 5 further comprising:

distributing the compressed data stream along with the preprocessor-driving information to the destination computer;

identifying internal references that refer to locations in the blocks specified in the block motion list within a data stream resident on the destination computer; and modifying the identified internal references in the destination computer-resident data stream according to the movements in position of the respective blocks; and decoding the compressed data stream by retrieving portions of the preprocessed, destination computer-resident data stream that are referenced by the codes in the compressed data stream;

forming a decompressed data stream from the retrieved portions.

7. A method of decompressing a compressed data stream at a computer, comprising:

receiving the compressed data stream and preprocessing information from a distribution medium;

processing a reference data stream resident on the computer according to the preprocessing information;

loading the reference data stream into a dictionary store;

decoding a plurality of dictionary reference codes in the compressed data stream that reference into the dictionary store by retrieving referenced portions of the reference data stream from the dictionary store; and forming a decompressed data stream from the retrieved portions.

8. The method of claim 7 comprising further retrieving an identity of the reference data stream from the distribution medium.

9. The method of claim 7 wherein the preprocessing information includes block motion indicating information and wherein the step of processing the reference data stream comprises:

identifying internal references in the reference data stream that are affected by the block motion; and modifying the internal references to compensate for the block motion.

10. In a compression method performed on a computer that compresses source data relative to a reference data to produce compressed data, an improvement comprising the steps of:

detecting changes in location of sections in the source data with respect to like sections of the reference data;

generating change data descriptive of the sections' location changes;

modifying the reference data in a deterministic manner in accordance with the change data; and compressing the source data relative to the modified reference data using the compression method to produce compressed data.

11. The improvement of claim 10 further comprising:

transmitting the change data and compressed data to a second computer on which the reference data also resides;

modifying the reference data on the second computer in the deterministic manner in accordance with the change data; and decompressing the compressed data relative to the modified reference data to produce the source data on the second computer.

12. The improvement of claim 10 wherein the compression method is dictionary data compression.

13. The improvement of claim 10 wherein the compression method is a variety of LZ data compression.

14. The improvement of claim 10 wherein the detecting step comprises, iteratively:
    loading the reference data into a sliding history window data store;
    for a plurality of successive strings of the source data, searching for a matching string in the sliding history window data store that matches a respective one of the source data strings, recording an offset of the matching string in the sliding history window data store, and feeding the source data strings into the sliding history window data store;
    identifying shifts in the offsets of the matching strings to groups of consecutive source data strings; and
    identifying the location changes from the shifts in the offsets.

15. The improvement of claim 10 wherein the detecting step comprises identifying the changes in location of the sections from cross-referencing information sources associated with the source and reference data.

16. The improvement of claim 10 wherein the cross-referencing information sources include at least one of symbol tables, symbol browsing data, debug data, source code, change logs, and linking maps.

17. The improvement of claim 10 wherein the detecting step comprises:
    scanning the source and reference data to locate similar sections; and
    deducing the location changes of the sections from any difference in location of the similar sections between the source and reference data.

18. The improvement of claim 10 wherein the detecting step comprises deducing the changes in location of the sections as a numerical sum of any preceding insertion and deletions.

19. The improvement of claim 10 wherein the detecting step comprises:
    compressing the source data including by matching strings of the source data to strings of the reference data to produce a compressed data stream having match codes indicating the matched strings;
    scanning the compressed data stream for the match codes; and
    translating the match codes into the change data descriptive of the sections' location changes.

20. The improvement of claim 10 wherein the detecting step comprises:
    scanning the source and reference data to detect executable code instructions that have references to locations in the sections;
    identifying the locations of the sections in each of the source and reference data from the locations referenced in the executable code instructions;
    determining changes in the locations of the sections from the reference data to the source data; and
    producing the change data based on the determined location changes.

21. The improvement of claim 10 further comprising filtering the change data to eliminate duplicative information.

22. The improvement of claim 21 wherein the change data includes a plurality of location change records that indicate the change in location of a section as a section location and displacement, the location change records being sorted by the section location, the improvement further comprising filtering the change data to eliminate location change records where the displacement is the same as an immediately adjacent location change record.

23. The improvement of claim 21 wherein the change data includes a plurality of location change records that indicate the change in location of a section as a section location and displacement, the location change records being sorted by the section location, the improvement further comprising filtering the change data to eliminate location change records where the displacement is zero.

24. The improvement of claim 10 further comprising filtering the change data to eliminate information of location changes that fail to yield improved compression of the source data.

25. The improvement of claim 10 wherein the compression method produces the compressed data having match codes, and the improvement further comprises filtering the change data to eliminate information of location changes that can be inferred from the match codes.

26. The improvement of claim 10 further comprising filtering the change data to eliminate information of location changes where the eliminated information fails to yield a sufficient improvement in compression to offset the size of the eliminated information.

27. The improvement of claim 10 wherein the step of modifying the reference data comprises:
    scanning the reference data to detect executable code instructions that have references to locations in the sections;
    adjusting the values of the references to reflect the change in location of the sections indicated by the change data.

28. The improvement of claim 27 wherein the change data includes data distinguishing executable code portions to be subject to the modifying step and non-executable code portions not subject to the modifying step.

29. The improvement of claim 10 wherein the change data includes data distinguishing portions of the reference data subject to modifying in the modifying step, and other portions not subject to the modifying step.

30. The improvement of claim 10 wherein the step of modifying comprises:
    identifying an internal data structure of the reference data that indicates locations in the reference data of references to location in the sections; and
    adjusting the values of the references to reflect the change in location of the sections indicated by the change data.

31. A file patching system for updating files on computers, comprising:
    on a patch mastering computer, a patch generator, compression-side preprocessor and compression engine,
        the compression engine having a dictionary store and operative to compress an input file with respect to data loaded in the dictionary store;
        the preprocessor deterministically modifying data in an old version file to form a preprocessed reference file that more closely resembles the new version file based on a set of preprocessing directives;
        the patch generator for receiving a new version file of an old version file and operative to load the preprocessed reference file into the dictionary store of the compression engine, to input the new version file to the compression engine to cause the compression engine to produce compressed data, and to combine the compressed data with the preprocessing directives to form a patch;

on an end-use computer having the old version file stored thereon, a patch applier, a decompression-side preprocessor, and a decompression engine, the decompression engine having a dictionary store and operative to decompress compressed data with respect to data loaded in the dictionary store;

the decompression-side preprocessor deterministically modifying data in the stored old version file to form the preprocessed reference file based on a set of preprocessing directives; and the patch applier for receiving the patch, and operative to provide the preprocessing directives from the patch to the decompression-side preprocessor to thereby produce the preprocessed reference file, to load the preprocessed reference file into the dictionary store of the decompression engine, and to input the compressed data from the patch to the decompression engine so as to cause the decompression engine to reproduce the new version file.

32. The file patching system of claim 31 further comprising on the patch mastering computer:

a block motion detector for detecting change in position of block portions from the old version file to the new version file;

a preprocessing directives generator for generating the preprocessing directives to indicate the block portions and their change in position; and wherein the preprocessors modify the data from the old version files by identifying reference values that make reference to locations in the block portions indicated by the preprocessing directives, and transforming the reference values according to the change in position of the respective block portions.

* * * * *

UNITED STATES PATENT AND TRADEMARK OFFICE
CERTIFICATE OF CORRECTION

PATENT NO.    : 6,466,999 B1                                   Page 1 of 1
DATED         : October 15, 2002
INVENTOR(S)   : Sliger et al.

It is certified that error appears in the above-identified patent and that said Letters Patent is hereby corrected as shown below:

Column 9,
Line 35, "list block" should read -- lists block --.

Column 10,
Line 21, "reference" should read -- references --.

Column 15,
Line 35, (page 25, line 20 of application) "art" should read -- art that the principles of the invention --.

Column 19,
Lines 38-39, "insertion and ..." should read -- insertions and --.

Signed and Sealed this

Tenth Day of June, 2003

JAMES E. ROGAN
*Director of the United States Patent and Trademark Office*